United States Patent
Qiao et al.

(10) Patent No.: US 11,387,429 B2
(45) Date of Patent: Jul. 12, 2022

(54) DISPLAY SUBSTRATE HAVING A BUFFER STRUCTURE, MANUFACTURING METHOD THEREOF AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zi Qiao, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 563 days.

(21) Appl. No.: 16/346,475

(22) PCT Filed: Oct. 9, 2018

(86) PCT No.: PCT/CN2018/109422
§ 371 (c)(1),
(2) Date: Apr. 30, 2019

(87) PCT Pub. No.: WO2019/114387
PCT Pub. Date: Jun. 20, 2019

(65) Prior Publication Data
US 2021/0328179 A1    Oct. 21, 2021

(30) Foreign Application Priority Data
Dec. 15, 2017   (CN) .......................... 201711346259.1

(51) Int. Cl.
*H01L 51/52* (2006.01)
*H01L 51/56* (2006.01)
(Continued)

(52) U.S. Cl.
CPC .......... *H01L 51/5253* (2013.01); *H01L 51/56* (2013.01); *H01L 27/3276* (2013.01);
(Continued)

(58) Field of Classification Search
CPC .......................... H01L 51/5253; H01L 51/56
See application file for complete search history.

(56) References Cited

U.S. PATENT DOCUMENTS 9,829,749 B2 * 11/2017 Kim .................. G02F 1/133351
2004/0125320 A1 * 7/2004 Bouten ............... G02F 1/13394
349/156
(Continued)

FOREIGN PATENT DOCUMENTS

CN      105977400 A      9/2016
CN      106783926 A      5/2017
(Continued)

OTHER PUBLICATIONS

International Search Report and Written Opinion for Application No. PCT/CN2018/109422, dated Jan. 9, 2019, 10 Pages.

*Primary Examiner* — Caleb E Henry
(74) *Attorney, Agent, or Firm* — Brooks Kushman P.C.

(57) ABSTRACT

A display substrate, a manufacturing method thereof, and a display apparatus are provided. The display substrate includes a display region and a non-display region surrounding the display region, and the non-display region includes a bending region and a buffer structure. The bending region is coated with a rheological material, and the buffer structure is arranged in the bending region and configured to block the rheological material from flowing out of the bending region.

17 Claims, 4 Drawing Sheets

(51) Int. Cl.
    *H01L 27/32*      (2006.01)
    *H01L 51/00*      (2006.01)
(52) U.S. Cl.
    CPC ...... *H01L 27/3288* (2013.01); *H01L 51/0097* (2013.01); *H01L 2251/5338* (2013.01)

(56) References Cited

U.S. PATENT DOCUMENTS

| | | | |
|---|---|---|---|
| 2006/0158114 A1* | 7/2006 | Moon | H01J 11/44 |
| | | | 313/582 |
| 2011/0135849 A1* | 6/2011 | Kruesemann | B32B 15/04 |
| | | | 428/196 |
| 2016/0268325 A1* | 9/2016 | Hsieh | H01L 27/14618 |
| 2017/0179423 A1* | 6/2017 | Kwon | H01L 27/3276 |
| 2017/0244061 A1 | 8/2017 | Jin et al. | |
| 2018/0224688 A1 | 8/2018 | Chen et al. | |
| 2019/0057634 A1 | 2/2019 | Xue et al. | |

FOREIGN PATENT DOCUMENTS

| | | |
|---|---|---|
| CN | 107123667 A | 9/2017 |
| CN | 107331800 A | 11/2017 |
| CN | 108074939 A | 5/2018 |
| CN | 207516696 U | 6/2018 |
| EP | 3182474 A1 | 6/2017 |

\* cited by examiner

DISPLAY SUBSTRATE HAVING A BUFFER STRUCTURE, MANUFACTURING METHOD THEREOF AND DISPLAY APPARATUS

CROSS-REFERENCE TO RELATED APPLICATIONS

This application is the U.S. national phase of PCT Application No. PCT/CN2018/109422 filed on Oct. 9, 2018 which claims priority to Chinese Patent Application No. 201711346259.1 filed on Dec. 15, 2017, which are incorporated herein by reference in their entireties.

TECHNICAL FIELD

The present disclosure relates to the field of display technology, for example, to a display substrate, a manufacturing method thereof, and a display apparatus.

BACKGROUND

In related technology, in order to realize a narrow border of a display, the technology of pad bending in a circuit region is used. In using this technology, an adhesive is applied in a bending region to adjust a position of a neutral layer of the bending region, such that when the bending region is bent, lines in the bending region suffer a small stress and are not likely to be damaged. Furthermore, the adhesive applied in the bending region can also prevent penetration and corrosion of external water and oxygen to the bending region.

SUMMARY

A display substrate is provided, which includes a display region and a non-display region surrounding the display region, where the non-display region includes a bending region and a buffer structure, where the bending region is coated with a rheological material, and the buffer structure is arranged in the bending region and configured to block the rheological material from flowing out of the bending region.

In some embodiments, the bending region includes a curved edge and a non-curved edge, and the buffer structure includes a wall arranged along the non-curved edge.

In some embodiments, a cross section of the wall perpendicular to an extension direction of the wall has a trapezoidal shape, an inverted trapezoidal shape, a triangular shape, a semicircular shape or a rectangular shape.

In some embodiments, the buffer structure includes multiple barriers arranged in an array within the bending region.

In some embodiments, at least one of the barriers arranged in an array is of a spherical shape, a cylindrical shape or a rectangular pillar shape.

In some embodiments, the buffer structure includes multiple strip-shaped grooves in the bending region, an extension of the multiple strip-shaped grooves is parallel to the non-curved edge, and the multiple strip-shaped grooves are configured to accommodate the rheological material.

In some embodiments, a cross section of at least one of the strip-shaped grooves perpendicular to the extension direction of the grooves has a trapezoidal shape, an inverted trapezoidal shape, a triangular shape, a semicircular shape, or a rectangle shape.

In some embodiments, the buffer structure includes multiple grooves arranged in an array, and the grooves arranged in an array are arranged in the bending region, and configured to accommodate the rheological material.

In some embodiments, a cross section of at least one of the grooves arranged in an array in a direction perpendicular to the display substrate has a trapezoidal shape, an inverted trapezoidal shape, a semi-circular shape or a rectangular shape.

A display apparatus is provided, which includes the display substrate as described above.

A method for manufacturing a display substrate is provided, which includes:

forming a buffer structure in a bending region of a non-display region, the buffer structure being configured to block a rheological material from flowing out of the bending region;

applying the rheological material to the bending region where the buffer structure is formed;

where the display substrate includes a display region and the non-display region surrounding the display region.

In some embodiments, forming the buffer structure in the bending region of the non-display region, the buffer structure being configured to block the rheological material from flowing out of the bending region includes:

forming an insulating material layer in the bending region, and applying a photoresist to the insulating material layer, where the bending region includes a curved edge and a non-curved edge;

forming a photoresist reserved region and a photoresist removal region after exposing and developing the photoresist, where the photoresist reserved region extends along the non-curved edge; and removing the insulating material layer in the photoresist removal region, and stripping the photoresist of the photoresist reserved region, to form a wall extending along the non-curved edge, where the buffer structure includes the wall.

In some embodiments, forming the buffer structure in the bending region of the non-display region, the buffer structure being configured to block the rheological material from flowing out of the bending region includes:

forming a wall extending along a non-curved edge of the bending region by an ink-jet printing process with an insulating material, where the bending region includes a curved edge and the non-curved edge, and the buffer structure includes the wall.

In some embodiments, forming the buffer structure in the bending region of the non-display region, the buffer structure being configured to block the rheological material from flowing out of the bending region includes:

forming an insulating material layer in the bending region, and applying a photoresist to the insulating material layer;

forming photoresist reserved regions and a photoresist removal region after exposing and developing the photoresist, where the photoresist reserved regions are arranged in an array in the bending region; and removing the insulating material layer in the photoresist removal region, and stripping the photoresist of the photoresist reserved regions, to form multiple barriers arranged in an array in the bending region, where the buffer structure includes the multiple barriers arranged in an array.

In some embodiments, forming the buffer structure in the bending region of the non-display region, the buffer structure being configured to block the rheological material from flowing out of the bending region includes:

forming multiple barriers arranged in an array in the bending region by an ink-jet printing process with an insulating material, where the buffer structure includes the barriers arranged in an array.

In some embodiments, forming the buffer structure in the bending region of the non-display region, the buffer structure being configured to block the rheological material from flowing out of the bending region includes:

forming a flat layer in the bending region, and applying a photoresist to the flat layer, where the bending region includes a curved edge and a non-curved edge;

forming a photoresist reserved region and a photoresist removal region after exposing and developing the photoresist, where the photoresist removal region is parallel to the non-curved edge of the bending region; and removing the flat layer in the photoresist removal region, and stripping the photoresist of the photoresist reserved region, to form multiple strip-shaped grooves on a surface of the flat layer in contact with the rheological material, where an extension direction of the strip-shaped grooves is parallel with the non-curved edge, and the buffer structure includes the strip-shaped grooves.

In some embodiments, forming the buffer structure in the bending region of the non-display region, the buffer structure being configured to block the rheological material from flowing out of the bending region includes:

forming a flat layer in the bending region, and applying a photoresist to the flat layer;

forming a photoresist reserved region and photoresist removal regions after exposing and developing the photoresist, where the photoresist removal regions are arranged in an array in the bending region; and removing the flat layer in the photoresist removal regions, and stripping the photoresist of the photoresist reserved region, to form multiple grooves arranged in an array on a surface of the flat layer in contact with the rheological material, where the buffer structure includes the grooves arranged in an array.

DETAILED DESCRIPTION

Figure 1:
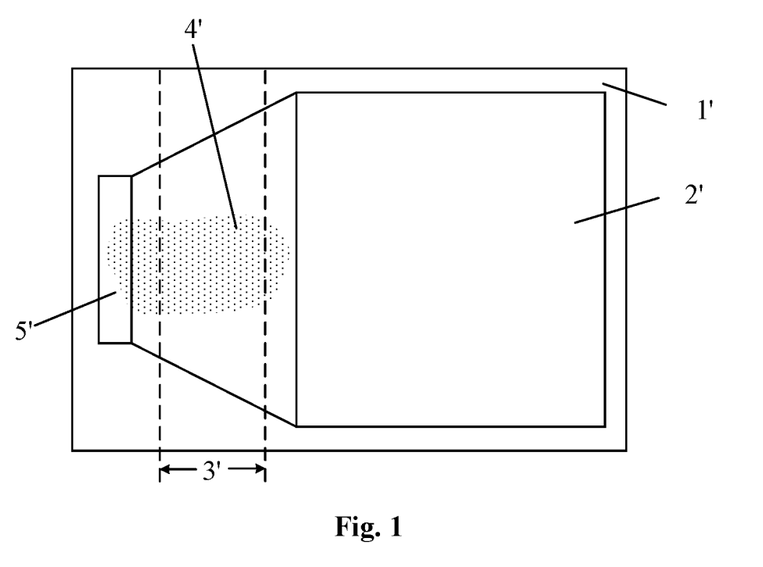
FIG. 1 is a plan view of a display substrate in the related technology.

FIG. 1 is a plan view of a display substrate in the related technology. As shown in FIG. 1, the display substrate includes a non-display region 1' and a display region 2'. The non-display region 1' includes a bending region 3'.

In the process of applying an adhesive 4' to the bending region 3', as shown in FIG. 1, since the adhesive 4' has fluidity, an edge position of the cured adhesive 4' is difficult to control. There is a risk that the adhesive 4' applied to the bending region flows into a chip on film (COF) circuit region 5' and a temporary process film (TPF) region on two sides of the bending region, affecting the COF bonding effect and the TPF peeling process, thus lowering the yield of the display apparatus.

In the related technology, in order to prevent the adhesive applied to the bending region from flowing to the COF circuit region and the TPF region on two sides of the bending region, a large adhesive flowing space is reserved on each side of the bending region. However, the size of the reserved space is difficult to control and is not conducive to achieving a narrow border design of the display apparatus.

In some embodiments of the present disclosure, a display substrate, a manufacturing method thereof, and a display apparatus are provided, which can prevent the adhesive applied to the bending region from flowing outside the bending region, thereby ensuring the yield of the display apparatus.

Figure 2:
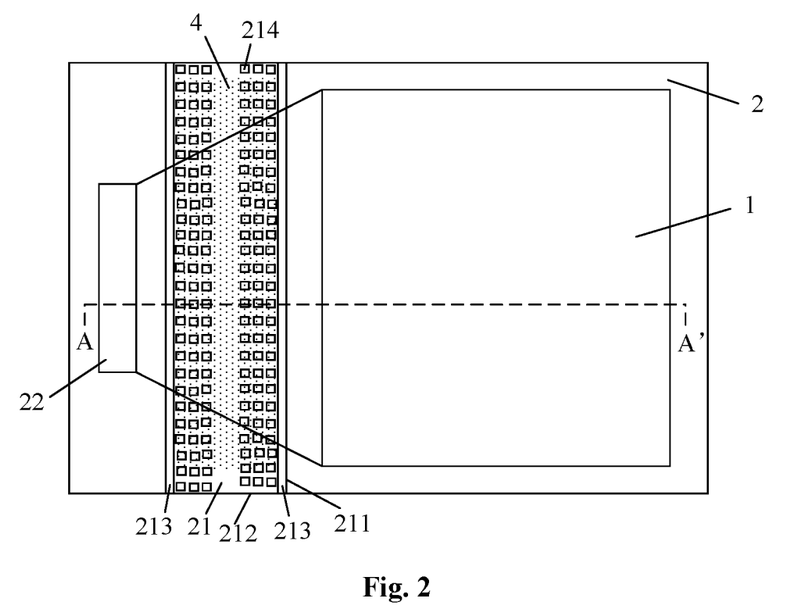
FIG. 2 is a plan view of a display substrate according to some embodiments.
Figure 3:
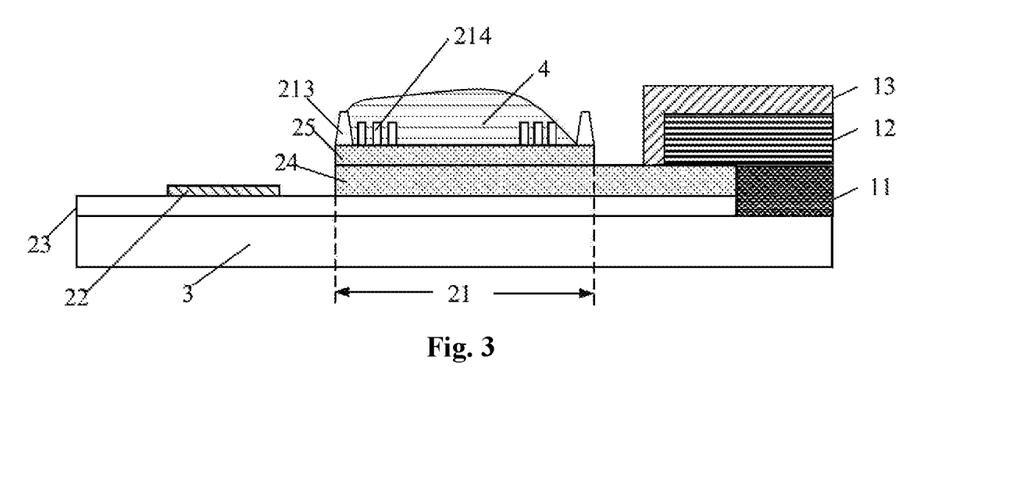
FIG. 3 is a cross-sectional view of the display substrate taken along line AA' of FIG. 2.

In some embodiments of the present disclosure, a display substrate is provided. As shown in FIGS. 2 and 3, the display substrate includes a display region 1 and a non-display region 2 surrounding the display region 1, the non-display region 2 including a bending region 21 and a buffer structure. The bending region 21 is coated with a rheological material, and the buffer structure is arranged in the bending region 21 and is configured to block the rheological material from flowing out of the bending region 21.

In the embodiments, the buffer structure is formed before coating the bending region with the rheological material, so that when the rheological material is applied to the bending region, the buffer structure can reduce the flowing speed of the rheological material, thus the rheological material can be cured before flowing outside the bending region and will not flow to the COF bonding region and the TPF region on two sides of the bending region, to ensure the yield of the display apparatus.

In some embodiments, as shown in FIG. 2, the bending region 21 includes a non-curved edge 211 and a curved edge 212, and the buffer structure includes a wall 213 arranged along the non-curved edge 211 of the bending region 21. The wall 213 is configured to block the flow of the rheological material out of the bending region 21.

In some embodiments, a cross-section of the wall 213 perpendicular to an extension direction of the wall 213 is trapezoidal shaped, inverted trapezoidal shaped, triangular shaped, semi-circular shaped or rectangular shaped. Referring to FIG. 3, the buffer structure includes two walls 213, i.e., a first wall at a side close to a COF circuit region 22 and a second wall at a side away from the COF circuit region 22.

In some embodiments, the cross-section of the first wall perpendicular to the extension direction of the first wall is identical to the cross-section of the second wall perpendicular to the extension direction of the second wall.

In some embodiments, the cross-section of the first wall perpendicular to the extension direction of the first wall is different from the cross-section of the second wall perpendicular to the extension direction of the second wall. For example, the first wall has a trapezoidal cross section perpendicular to the extension direction of the first wall, and the second wall has a triangular cross section perpendicular to the extension direction of the second wall.

In some embodiments, as shown in FIG. 3, the display substrate includes a flexible substrate 3. The non-display region 2 includes an inorganic insulating layer 23 arranged on the flexible substrate 3, a COF circuit region 22 arranged on the inorganic insulating layer 23, and a first flat layer 24 and a second flat layer 25 successively arranged on the inorganic insulating layer 23.

The display substrate further includes an organic light emitting display layer 11, a thin film encapsulation (TFE) layer 12 and a protective film TPF 13 which are successively stacked. The organic light emitting display layer 11 is located in the display region, and the TFE layer 12 and the TPF 13 overlap both of the display region 1 and the non-display region 2.

In some embodiments, as shown in FIGS. 2 and 3, the buffer structure includes multiple barriers 214 arranged in an array within the bending region 21. The barriers 214 are capable of reducing the flowing rate of the rheological material, and accelerating the curing rate of the rheological material before the rheological material flows out of the bending region 21.

In some embodiments, at least one of the barriers 214 has a spherical shape, a cylindrical shape, or a rectangular shape.

In some embodiments, the barriers 214 are identical in shape. For example, the barriers 214 all have spherical shapes.

In some embodiments, the barriers 214 are different in shape. For example, some of the barriers 214 have spherical shapes, some of the barriers 214 have cylindrical shapes, and some of the barriers 214 have rectangular pillar shapes.

Figure 4:
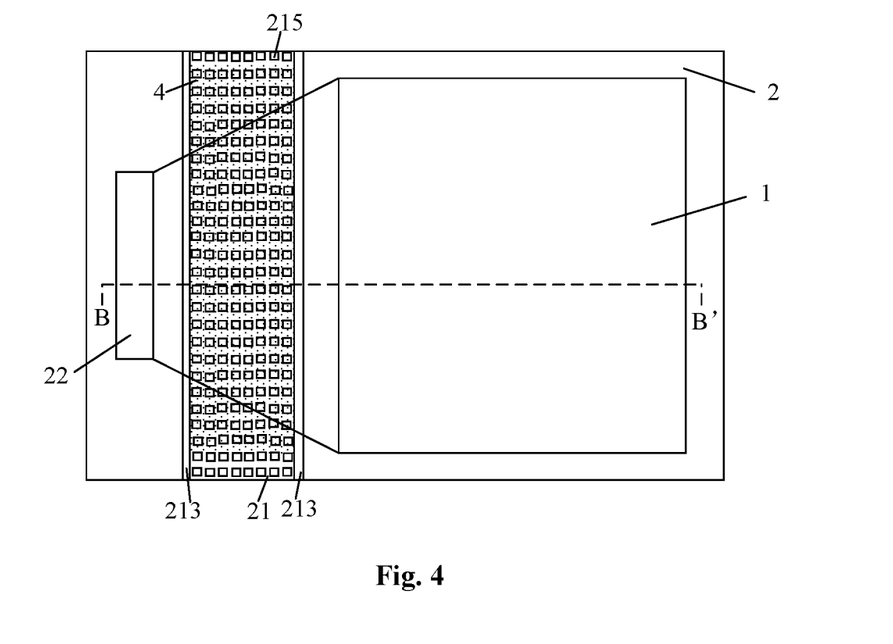
FIG. 4 is a plan view of a display substrate according to some other embodiments.
Figure 5:
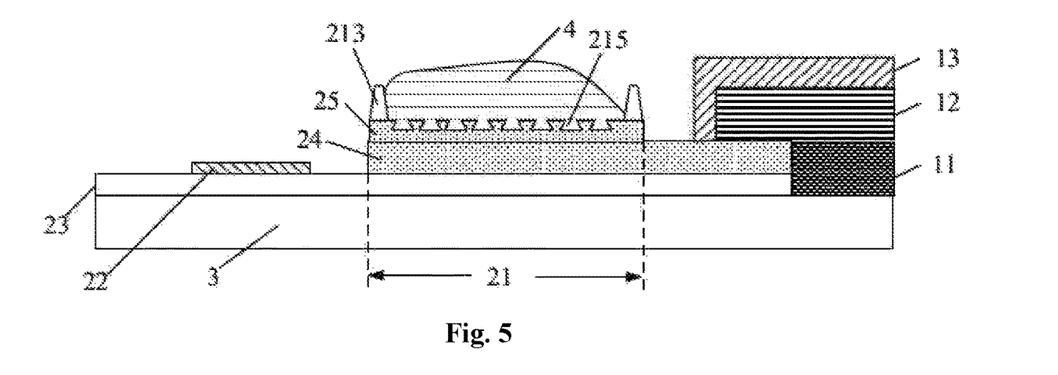
FIG. 5 is a cross-sectional view of the display substrate taken along line BB' of FIG. 4.

In some embodiments, as shown in FIGS. 4 and 5, the buffer structure includes multiple grooves 215 arranged in an array, the grooves 215 are arranged in the bending region 21, and configured to accommodate the rheological material.

The grooves 215 arranged in an array can block the flow of the rheological material, accelerate the curing speed of the rheological material before the rheological material flows out of the bending region 21, and increase the adhesion force between the rheological material and the display substrate after the rheological material is cured, such that the organic film formed by curing the rheological material does not easily fall off from the display substrate.

In some embodiments, a cross section of at least one of the grooves 215 arranged in an array in a direction perpendicular to the display substrate has a trapezoidal shape, an inverted trapezoidal shape, a semi-circular shape, or a rectangular shape.

Figure 6:
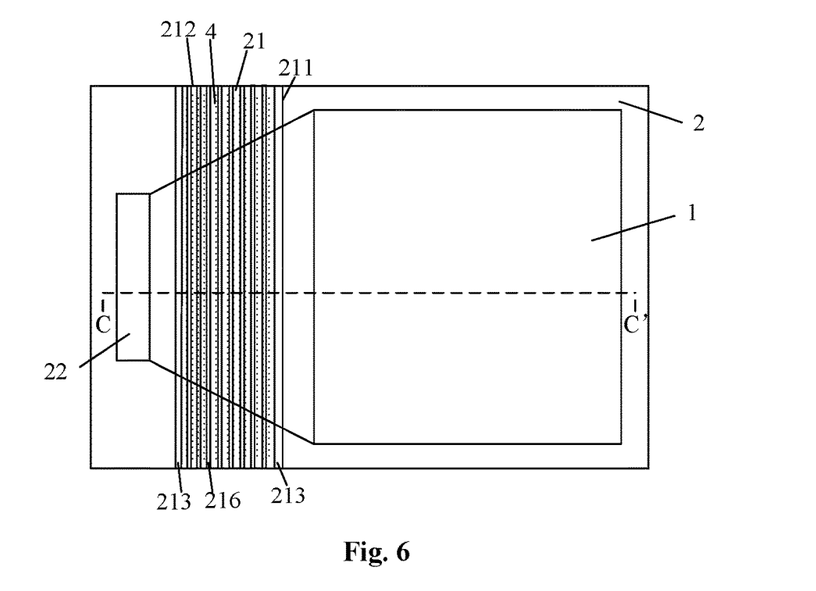
FIG. 6 is a plan view of a display substrate according to some other embodiments.
Figure 7:
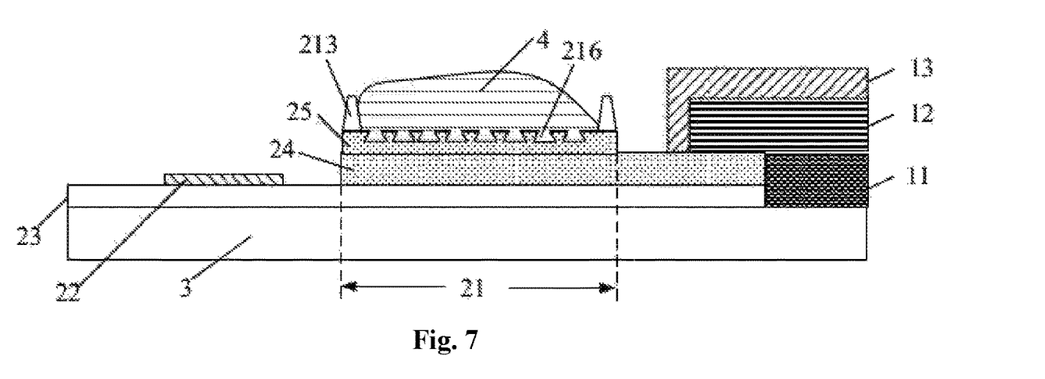
FIG. 7 is a cross-sectional view of the display substrate taken along line CC' of FIG. 6.

In some embodiments, as shown in FIGS. 6 and 7, the bending region 21 includes a non-curved edge 211 and a curved edge 212, and the buffer structure includes multiple strip-shaped grooves 216 in the bending region 21. The strip-shaped grooves 216 have an extension direction parallel or substantially parallel to the non-curved edge 211 of the bending region, and the strip-shaped grooves 216 are configured to accommodate the rheological material.

In some embodiments, the extending direction of the strip-shaped grooves 216 being substantially parallel to the non-curved edge 211 refers to an absolute value of an acute angle between the extending direction of the strip-shaped grooves 216 and the non-curved edge 211 being greater than 0° and being smaller than or equal to 5°.

The strip-shaped grooves 216 can block the flow of the rheological material, accelerate the curing speed of the rheological material before the rheological material flows out of the bending region 21, and increase the adhesion force between the rheological material and the display substrate after the rheological material is cured, such that the organic film formed by curing the rheological material does not easily fall off from the display substrate.

In some embodiments, a cross section of at least one of the strip-shaped grooves 216 perpendicular to the extension direction of the grooves has a trapezoidal shape, an inverted trapezoidal shape, a triangular shape, a semi-circular shape, or a rectangular shape.

In some embodiments, the cross sections of the strip-shaped grooves 216 perpendicular to the extension direction of the grooves are identical. For example, the cross sections of the strip-shaped grooves 216 perpendicular to the extension direction of the grooves have trapezoidal shapes.

In some embodiments, the cross sections of the strip-shaped grooves 216 perpendicular to the extension direction of the grooves are different. For example, the cross sections of some of the strip-shaped grooves 216 perpendicular to the extension direction of the grooves have trapezoidal shapes, while the cross sections of others of the strip-shaped grooves 216 perpendicular to the extension direction of the grooves have triangle shapes.

Hereinafter, the display substrate according to some embodiments of the present disclosure will be described in detail in conjunction with the drawings by taking the rheological material being adhesive 4 as an example.

In some embodiments, as shown in FIGS. 2 and 3, the display substrate includes a display region 1 and a non-display region 2.

In some embodiments, the first flat layer 24 and the second flat layer 25 each are made of an organic resin material.

The non-display region 2 further includes a COF circuit region 22 arranged outside the bending region 21.

As shown in FIG. 3, walls 213 are arranged on the second flat layer 25, and the walls 213 extend along the non-curved edge 211 of the bending region 21, and multiple columnar barriers 214 are arranged in an array between the two walls 213.

When the adhesive 4 is applied on the bending region 21, the walls 213 block the adhesive 4 from flowing to a region outside the bending region 21, while the barrier 214 can reduce the flowing speed of the adhesive 4, and accelerate the curing speed before the adhesive 4 flows out of the bending region. By arranging the walls 213 and the barriers 214, the adhesive 4 is restricted to the bending region 21, preventing the applied adhesive 4 from flowing to the COF circuit region 22 and other regions.

In some embodiments, as shown in FIGS. 4 and 5, multiple grooves 215 arranged in an array are formed on the surface of the second flat layer 25, which is different from the display substrate of FIGS. 2 and 3.

When the adhesive 4 is applied on the bending region 21, the wall 213 blocks the adhesive 4 from flowing to a region outside the bending region 21, while the grooves 215 arranged in an array can reduce the flowing speed of the adhesive 4, accelerate the curing speed of the adhesive 4 before adhesive 4 flows out of the bending region 21, and increase the adhesion force between the adhesive 4 and the display substrate after the adhesive 4 is cured, so that the adhesive layer formed by curing the adhesive 4 does not easily fall off from the display substrate.

The adhesive 4 is restricted to the bending region 21 by arranging the walls 213 and the multiple grooves 215 arranged in an array, which prevents the applied adhesive 4 from flowing to the COF region 22 and other regions.

In some embodiments, as shown in FIG. 6 and FIG. 7, multiple strip-shaped grooves 216 are formed on the surface of the second flat layer 25, and the extension direction of the strip-shaped grooves 216 is substantially parallel or parallel to the non-curved edge 211 of the bending region 21, which is different from the display substrate of FIGS. 4 and 5.

When the adhesive 4 is applied on the bending region 21, the wall 213 blocks the adhesive 4 from flowing to the region outside the bending region 21, while the strip-shaped grooves 216 can reduce the flowing speed of the adhesive 4, accelerate the curing speed of the adhesive 4 before the adhesive 4 flows out of the bending region 21, and increase the adhesion force between the adhesive and the display substrate after the adhesive 4 is cured, so that the adhesive layer formed by curing the adhesive 4 does not easily fall off from the display substrate.

By arranging the walls 213 and the strip-shaped grooves 216, the adhesive 4 can be restricted to the bending region 21 to prevent the applied adhesive 4 from flowing to the COF region 22 and other regions.

According to some embodiments, a display apparatus including a display substrate as described above is provided.

In some embodiments, the display apparatus may be a product or component having a display function, such as a television, a display, a digital photo frame, a mobile phone, or a tablet computer, and the display apparatus may further include a flexible circuit board, a printed circuit board, and a backplane.

Figure 8:
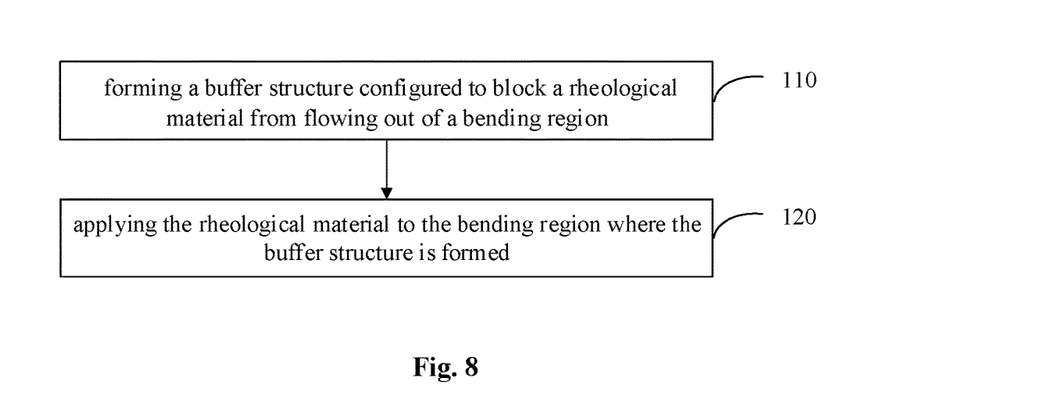
FIG. 8 is a flow chart of a method for manufacturing a display substrate according to some embodiments.

In some embodiments, a method for manufacturing a display substrate is provided, the display substrate including a bending region which is bendable. Referring to FIG. 8, the manufacturing method may include steps 110 and 120.

Step 110 includes forming a buffer structure configured to block a rheological material from flowing out of a bending region.

Step 120 includes applying the rheological material to the bending region where the buffer structure is formed.

In the above method embodiments, before the bending region is coated with the rheological material, the buffer structure is formed, so that when the rheological material is applied to the bending region, the buffer structure can block the rheological material from flowing out of the bending region, in this way, the rheological material is cured before flowing out of the bending region, and the rheological material does not flow to the COF bonding region and the TPF region at two sides of the bending region, thereby ensuring the yield of the display apparatus.

In some embodiments, the bending region includes a curved edge and a non-curved edge, and forming the buffer structure includes:

forming an insulating material layer in the bending region, and applying a photoresist to the insulating material layer;

forming a photoresist reserved region and a photoresist removal region after exposing and developing the photoresist, the photoresist reserved region extending along the non-curved edge; and removing the insulating material layer in the photoresist removal region, and stripping the photoresist of the photoresist reserved region, to form a wall extending along the non-curved edge, where the buffer structure includes the wall.

In some embodiments, a wall extending along a non-curved edge of the bending region is formed by an ink-jet printing process with the insulating material, the bending region including a curved edge and the non-curved edge, and the buffer structure including the wall.

The wall blocks the rheological material from flowing out of the bending region.

In some embodiments, a cross section of the wall perpendicular to an extension direction of the wall is trapezoidal shaped, inverted trapezoidal shaped, triangular shaped, semi-circular shaped or rectangular shaped.

In some embodiments, forming the buffer structure includes:

forming an insulating material layer in the bending region, and applying a photoresist to the insulating material layer;

forming a photoresist reserved region and photoresist removal regions after exposing and developing the photoresist, the photoresist reserved regions being arranged in an array in the bending region; and removing the insulating material layer in the photoresist removal region, and stripping the photoresist of the photoresist reserved region, to form multiple barriers arranged in an array in the bending region, the buffer structure including the barriers arranged in an array.

In some embodiments, multiple barriers arranged in an array are formed in the bending region by an ink-jet printing process with an insulating material, the buffer structure including the barriers arranged in an array.

The barriers are capable of reducing the flowing rate of the rheological material, and accelerating the curing rate of the rheological material before the rheological material flows out of the bending region.

In some embodiments, at least one of the barriers arranged in an array is of a spherical shape, a cylindrical shape or a rectangular pillar shape.

In some embodiments, the bending region includes a curved edge and a non-curved edge, and forming the buffer structure includes:

forming a flat layer in the bending region, and applying a photoresist to the flat layer;

forming a photoresist reserved region and a photoresist removal region after exposing and developing the photoresist, the photoresist removal region being parallel or substantially parallel to the non-curved edge of the bending region;

removing the flat layer in the photoresist removal region, and stripping the photoresist of the photoresist reserved region, to form multiple strip-shaped grooves on a surface of the flat layer in contact with the rheological material, where an extension direction of the strip-shaped grooves is parallel or substantially parallel to the non-curved edge, and the buffer structure includes the strip-shaped grooves.

The strip-shaped grooves can reduce the flowing speed of the rheological material, accelerate the curing speed of the rheological material before the rheological material flows out of the bending region, and increase the adhesion force between the rheological material and the display substrate after the rheological material is cured, so that an organic film formed by curing the rheological material does not easily fall off from the display substrate.

In some embodiments, a cross section of at least one of the strip-shaped grooves perpendicular to the extension direction of the grooves has a trapezoidal shape, an inverted trapezoidal shape, a triangular shape, a semi-circular shape, or a rectangular shape.

In some embodiments, forming the buffer structure includes:

forming a flat layer in the bending region, and applying a photoresist to the flat layer;

forming a photoresist reserved region and photoresist removal regions after exposing and developing the photoresist, the photoresist removal regions being arranged in an array in the bending region;

removing the flat layer in the photoresist removal regions, and stripping the photoresist of the photoresist reserved region, to form multiple grooves arranged in an array on a surface of the flat layer in contact with the rheological material, where the buffer structure includes the grooves arranged in an array.

The multiple grooves arranged in an array can reduce the flowing rate of the rheological material, accelerate the curing rate of the rheological material before the rheological material flows out of the bending region, and increase adhesion force between the rheological material and the display substrate after the rheological material is cured, so that an organic film formed by curing the rheological material does not easily fall off from the display substrate.

In some embodiments, a cross section of at least one of the grooves arranged in an array in a direction perpendicular to the display substrate has a trapezoidal shape, an inverted trapezoidal shape, a semi-circular shape, or a rectangular shape.

The terms "first" and "second" and similar terms used in the present disclosure do not indicate any order, quantity, or importance, and are merely used to distinguish different components.

What is claimed is:

1. A display substrate, comprising:
    a display region and a non-display region surrounding the display region; and
    a buffer structure;
    wherein the non-display region comprises a bending region, and the buffer structure is in the bending region and configured to block a rheological material from flowing out of the bending region,
    wherein the bending region comprises at least one curved edge and at least one non-curved edge; and the buffer structure comprises a wall along the at least one non-curved edge,
    wherein the number of the at least one non-curved edge is two, and the two non-curved edges are opposite to each other; and wherein the number of the wall is two, and the two walls are along the two non-curved edges respectively,
    the buffer structure comprises a plurality of barriers or a plurality of grooves between the two walls.

2. The display substrate according to claim 1, wherein a cross section of the wall perpendicular to an extension direction of the wall has a trapezoidal shape, an inverted trapezoidal shape, a triangular shape, a semicircular shape or a rectangular shape.

3. The display substrate according to claim 1, wherein the plurality of barriers are arranged in an array within the bending region.

4. The display substrate according to claim 3, wherein at least one barrier of the plurality of barriers in an array is of a spherical shape, a cylindrical shape or a rectangular pillar shape.

5. The display substrate according to claim 1, wherein the plurality of grooves are a plurality of strip-shaped grooves between the two walls in the bending region, an extension direction of the plurality of strip-shaped grooves is parallel to the non-curved edge, and the plurality of strip-shaped grooves is configured to accommodate the rheological material.

6. The display substrate according to claim 5, wherein the non-display region comprises a flat layer, and the plurality of strip-shaped grooves are on a surface of the flat layer.

7. The display substrate according to claim 5, wherein a cross section of at least one groove of the plurality of strip-shaped grooves perpendicular to the extension direction of the grooves has a trapezoidal shape, an inverted trapezoidal shape, a triangular shape, a semicircular shape, or a rectangle shape.

8. The display substrate according to claim 1, wherein the plurality of grooves are arranged in an array, and the plurality of grooves in an array is between the two walls in the bending region, and configured to accommodate the rheological material.

9. The display substrate according to claim 8, wherein a cross section of at least one groove of the plurality of grooves in an array in a direction perpendicular to the display substrate has a trapezoidal shape, an inverted trapezoidal shape, a semi-circular shape or a rectangular shape.

10. A display apparatus, comprising the display substrate according to claim 1.

11. A method for manufacturing a display substrate, comprising:
    forming a buffer structure in a bending region of a non-display region surrounding a display region, the buffer structure being configured to block a rheological material from flowing out of the bending region,
    wherein the forming a buffer structure in a bending region of a non-display region surrounding a display region further comprises:
    forming an insulating material layer in the bending region, and applying a photoresist to the insulating material layer, wherein the bending region comprises at least one curved edge and at least one non-curved edge;
    forming a photoresist reserved region and a photoresist removal region after exposing and developing the photoresist, wherein the photoresist reserved region extends along the at least one non-curved edge; and
    removing the insulating material layer in the photoresist removal region, and stripping the photoresist of the photoresist reserved region, to form a wall extending along the at least one non-curved edge, wherein the buffer structure comprises the wall.

12. The method for manufacturing the display substrate according to claim 11, wherein the number of the at least one non-curved edge is two, and the two non-curved edges are opposite to each other; and
    removing the insulating material layer in the photoresist removal region, and stripping the photoresist of the photoresist reserved region, to form the wall extending along the at least one non-curved edge comprises:
    forming two walls along the two non-curved edges respectively.

13. The method for manufacturing the display substrate according to claim 12, wherein forming the buffer structure in the bending region of the non-display region surrounding the display region, the buffer structure being configured to block the rheological material from flowing out of the bending region comprises:
    forming an insulating material layer in the bending region, and applying a photoresist to the insulating material layer;
    forming photoresist reserved regions and a photoresist removal region after exposing and developing the photoresist, wherein the photoresist reserved regions are in an array between the two walls in the bending region; and
    removing the insulating material layer in the photoresist removal region, and stripping the photoresist of the photoresist reserved regions, to form a plurality of barriers in an array in the bending region, wherein the buffer structure comprising the plurality of barriers in an array.

14. The method for manufacturing the display substrate according to claim 12, wherein forming the buffer structure in the bending region of the non-display region surrounding the display region, the buffer structure being configured to block the rheological material from flowing out of the bending region comprises:

forming a plurality of barriers in an array between the two walls in the bending region by an ink-jet printing process with an insulating material, wherein the buffer structure comprises the plurality of barriers in an array.

15. The method for manufacturing the display substrate according to claim 12, wherein forming the buffer structure in the bending region of the non-display region surrounding the display region, the buffer structure being configured to block the rheological material from flowing out of the bending region comprises:

forming a flat layer in the bending region, and applying a photoresist to the flat layer;

forming a photoresist reserved region and a photoresist removal region after exposing and developing the photoresist, wherein the photoresist removal region is parallel to the non-curved edge of the bending region; and removing the flat layer in the photoresist removal region, and stripping the photoresist of the photoresist reserved region, to form a plurality of strip-shaped grooves on a surface of the flat layer in contact with the rheological material, wherein an extension direction of the plurality of strip-shaped grooves is parallel with the non-curved edge, the plurality of strip-shaped grooves is between the two walls in the bending region, and the buffer structure comprises the plurality of strip-shaped grooves.

16. The method for manufacturing the display substrate according to claim 12, wherein forming the buffer structure in the bending region of the non-display region surrounding the display region, the buffer structure being configured to block the rheological material from flowing out of the bending region comprises:

forming a flat layer in the bending region, and applying a photoresist to the flat layer;

forming a photoresist reserved region and photoresist removal regions after exposing and developing the photoresist, wherein the photoresist removal regions are in an array between the two walls in the bending region; and removing the flat layer in the photoresist removal regions, and stripping the photoresist of the photoresist reserved region, to form a plurality of grooves in an array on a surface of the flat layer in contact with the rheological material, wherein the buffer structure comprises the plurality of grooves in an array.

17. A method for manufacturing a display substrate, comprising:

forming a buffer structure in a bending region of a non-display region surrounding a display region, the buffer structure being configured to block a rheological material from flowing out of the bending region, wherein forming the buffer structure in the bending region of the non-display region surrounding the display region:

forming a wall extending along at least one non-curved edge of the bending region by an ink-jet printing process with an insulating material, wherein the bending region comprises at least one curved edge and the at least one non-curved edge, and the buffer structure comprises the wall.

\* \* \* \* \*